United States Patent [19]
Staudinger et al.

[11] Patent Number: 5,345,123
[45] Date of Patent: Sep. 6, 1994

[54] ATTENUATOR CIRCUIT OPERATING WITH SINGLE POINT CONTROL

[75] Inventors: Joseph Staudinger, Gilbert; John M. Golio; William B. Beckwith, both of Chandler, all of Ariz.; Jean B. Verdier, Tournefeuille, France

[73] Assignee: Motorola, Inc., Schaumburg, Ill.

[21] Appl. No.: 87,245

[22] Filed: Jul. 7, 1993

[51] Int. Cl.[5] .................................. H03H 11/00
[52] U.S. Cl. ............................ 307/552; 307/264; 307/568; 333/81 R
[58] Field of Search .......... 307/540, 543, 549, 544, 307/264, 552, 571, 494, 497, 304, 557, 568; 333/81 R

[56] References Cited

U.S. PATENT DOCUMENTS

| | | | |
|---|---|---|---|
| 3,621,284 | 11/1971 | Cluett et al. | 307/264 |
| 3,962,591 | 6/1976 | Popka | 307/264 |
| 4,047,131 | 9/1977 | Ludikhuize | 307/264 |
| 4,646,036 | 2/1987 | Brown | 307/264 |
| 4,668,882 | 5/1987 | Matsuura | 307/540 |
| 4,942,375 | 7/1990 | Petitjean et al. | 307/540 |
| 4,996,504 | 2/1991 | Huber et al. | 333/81 R |
| 5,115,143 | 5/1992 | Rohulich et al. | 307/571 |
| 5,148,062 | 9/1992 | Goldfarb | 307/571 |

FOREIGN PATENT DOCUMENTS

| | | | |
|---|---|---|---|
| 0260220 | 12/1985 | Japan | 333/81 R |
| 0312708 | 12/1988 | Japan | 333/81 R |
| 0312709 | 12/1988 | Japan | 333/81 R |
| 0312710 | 12/1988 | Japan | 333/81 R |
| 0143515 | 6/1989 | Japan | 333/81 R |

*Primary Examiner*—Timothy P. Callahan
*Assistant Examiner*—T. T. Lam
*Attorney, Agent, or Firm*—Robert D. Atkins

[57] ABSTRACT

An attenuator circuit uses single point control to adjust the attenuation levels between first and second nodes. The attenuator is set-up as a $\pi$-network with a pass transistor and first and second shunt transistors. Capacitors are coupled in the drain and source conduction paths of the first and second shunt transistors for DC isolation to float the shunt transistors. A control voltage applied at the drain of the pass transistor and the gates of the first and second shunt transistors controls the attenuation level. A parallel resistor and capacitor combination at the drain of the first shunt transistor provides tuning to match the input impedance of the attenuator to the sourcing circuit.

20 Claims, 1 Drawing Sheet

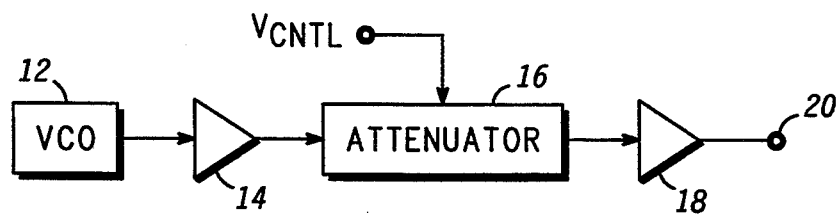
_10_ *Fig. 1*
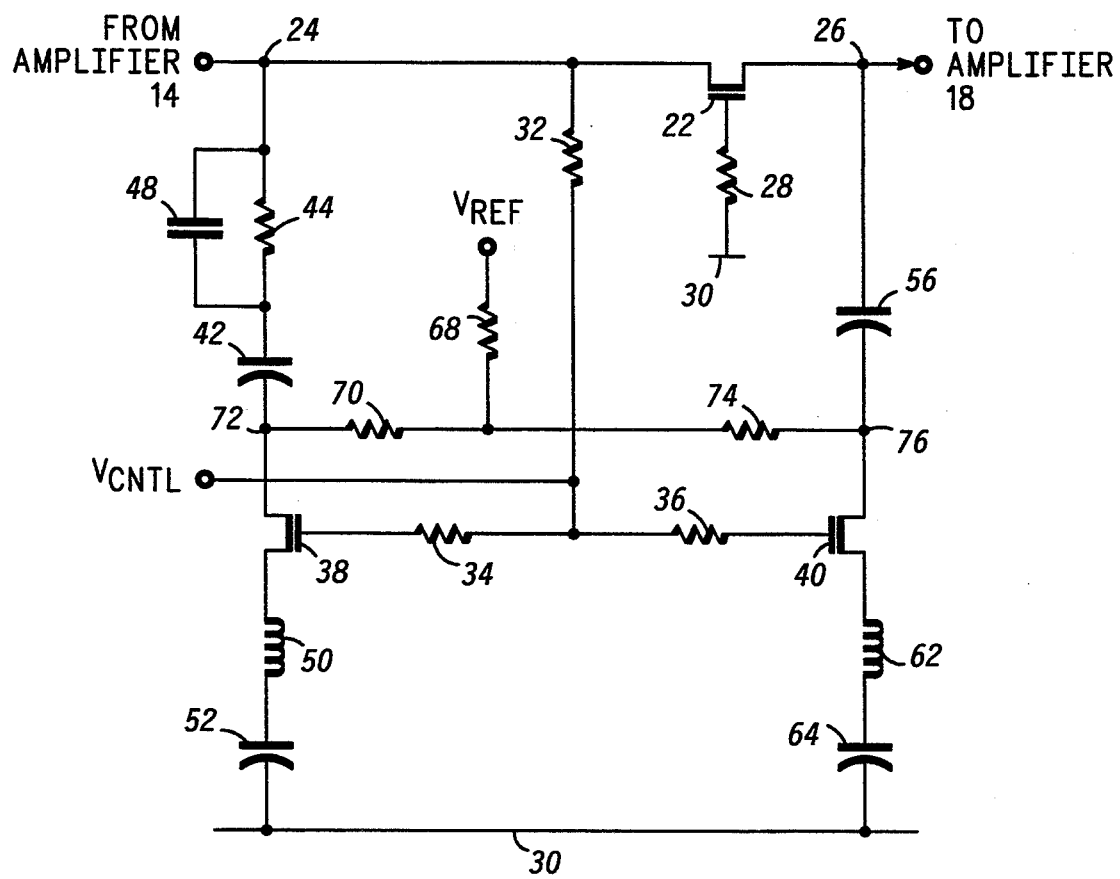
_16_ *Fig. 2*

ATTENUATOR CIRCUIT OPERATING WITH SINGLE POINT CONTROL

BACKGROUND OF THE INVENTION

The present invention relates in general to attenuator circuits and, more particularly, to an attenuator circuit operating with a single point control voltage.

Attenuator circuits are commonly used in electronic circuit design, for example in communication systems such as portable telephones, to provide attenuation of a signal between two operating nodes. Attenuator circuits may be controlled with a digital signal, or with one or more analog control signals, to set the level of attenuation as needed in the particular application. In the minimum attenuation state, the attenuator circuit exhibits very low insertion loss to allow propagation of the incoming signal, say from a voltage controlled oscillator (VCO). Alternately, in the maximum attenuation state, the attenuator circuit exhibits high insertion loss to block the incoming signal.

The attenuator circuit should maintain a constant load impedance to the input node at minimum and maximum levels of attenuation. Maintaining a matched load impedance is important especially in portable telephone applications where it is necessary to avoid reflections which may cause frequency pulling on the VCO. Furthermore, to maintain simplicity of the design, it is desirable to control the attenuator circuit with a signal point control voltage.

SUMMARY OF THE INVENTION

Briefly stated, the invention comprises an attenuator circuit for setting attenuation between first and second nodes in response to a control voltage including a first transistor having a drain for receiving an input signal from the first node, a gate coupled to a power supply conductor, and a source coupled to the second node. A second transistor includes a gate for receiving the control voltage, and a drain for receiving a reference voltage. A first capacitor is coupled between the first node and the drain of the second transistor, while a second capacitor is coupled between the source of the second transistor and the power supply conductor. A third transistor includes a gate for receiving the control voltage, and a drain for receiving the reference voltage. A third capacitor is coupled between the second node and the drain of the third transistor, and a fourth capacitor is coupled between the source of the third transistor and the power supply conductor.

BRIEF DESCRIPTION OF THE DRAWING

FIG. 1 is a block diagram illustrating an attenuator circuit between two amplifiers; and FIG. 2 is a schematic diagram illustrating the attenuator circuit of FIG. 1.

DETAILED DESCRIPTION OF THE PREFERRED EMBODIMENT

An attenuator circuit 10 is shown in FIG. 1 suitable for manufacturing an integrated circuit using conventional integrated circuit processes, e.g. GaAs monolithic microwave integrated circuit (MMIC) fabrication. An input signal is generated by VCO 12 and applied at the input of pre-driver amplifier 14 which provides an output signal to attenuator 16. A single point control voltage $V_{CNTL}$ is applied to attenuator 16 to control its level of attenuation. The output of attenuator 16 is coupled to the input of power driver amplifier 18 for providing an output signal at terminal 20. The output signal of amplifier 18 may drive another amplifier, or an antenna of a portable telephone (not shown).

A low control voltage $V_{CNTL}$, say 0.0 volts, sets a low level of attenuation and therefore a low insertion loss in order to pass the output signal of amplifier 14 to amplifier 18. Alternately, a high value of control voltage $V_{CNTL}$, say 5.0 volts, generates a high level of attenuation and correspondingly high insertion loss to essentially block the output signal of amplifier 14 from reaching the input of amplifier 18. It is important that the input impedance of attenuator 16 match to the output impedance of amplifier 14 at minimum and maximum levels of attenuation in order to prevent reflections from rippling back to VCO 12 and disrupt its frequency operation.

Turning to FIG. 2, attenuator 16 is shown in further detail including n-channel field effect transistor (FET) 22 having a drain coupled to the output of amplifier 14 at node 24 and a source coupled to the input of amplifier 18 at node 26. The gate of transistor 22 is coupled through resistor 28 to power supply conductor 30 operating at ground potential. The single point control voltage $V_{CNTL}$ is applied through resistor 32 to node 24 and further through resistors 34 and 36, respectively, to the gates n-channel of field effect transistors (FET) 38 and 40. The drain of transistor 38 is coupled through capacitor 42 and resistor 44 to node 24. Capacitor 48 is shunted to resistor 44 and may be selected at say 10 picofarads (pf). Resistor 44 and capacitor 48 are used to tune the input impedance of attenuator 16 to match the output impedance of amplifier 14 (e.g., $Z=100-j36$). The matched condition between the output of amplifier 14 and the input of attenuator 16 inhibits transient reflections which can adversely affect the frequency stability of VCO 12.

Continuing with FIG. 2, the source of transistor 38 is coupled through inductor 50 and capacitor 52 to power supply conductor 30. The drain of transistor 40 is coupled through capacitor 56 to node 26. Capacitors 42 and 56 may be selected at 20 pf. The source of transistor 40 is coupled through inductor 62 and capacitor 64 to power supply conductor 30. Inductors 50 and 62 may be selected at 2.0 nanohenries, and capacitors 52 and 64 may be selected at 10 pf. A reference voltage $V_{REF}$ operating at say 5.0 volts is applied through resistor 68 and resistor 70 to node 72 at the drain of transistor 38. Reference voltage $V_{REF}$ is also applied through resistor 68 and resistor 74 to node 76 at the drain of transistor 40. Transistors 22, 38 and 40 may be implemented as GaAs MESFET devices. Resistors 28, 32, 34, 36, 44, 68, 70 and 74 may each be set to 5K ohms to establish DC bias levels for transistors 22, 38 and 40.

The operation of attenuator 16 proceeds as follows. Transistor 22 operates as a pass transistor between nodes 24 and 26. Transistors 38 and 40 are connected in shunt with respect to nodes 24 and 26 thereby forming a $\pi$-network with transistor 22. As part of the present invention, capacitor 42 at the drain of transistor 38 and capacitor 52 at its source provide DC isolation and allow transistor 38 to float with respect to ground potential. Likewise, capacitor 56 at the drain of transistor 40 and capacitor 64 at its source provide DC isolation and allow transistor 40 to float with respect to ground potential. Nodes 72 and 76 are pulled to reference voltage $V_{REF}$ by way of resistors 68, 70 and 74. Transistor 22 also floats DC because nodes 24 and 26 are assumed to be AC-coupled by series capacitors (not shown).

Returning to FIG. 1, when it is necessary to alter the output frequency of VCO 12, amplifier 18 is disabled and attenuator circuit 16 is set to provide maximum attenuation for the output signal of amplifier 14. This isolates VCO 12 from power driver amplifier 18 and prevents pulling it off frequency during the transition. To set attenuator 16 to maximum attenuation, the control voltage $V_{CNTL}$ is brought to 5.0 volts and applied to the drain of transistor 22 via resistor 32. Transistor 22 is pinched off to increase its drain-to-source impedance to maximum. The gates of transistors 38 and 40 are brought to substantially the same voltage level as nodes 72 and 76 thereby turning on transistors 38 and 40 and shunting signals from nodes 24 and 26 to power supply conductor 30. Attenuator circuit 16 thus provides maximum attenuation and insertion loss, say 30 dB, when Control signal $V_{CNTL}$ is at a high value.

If control voltage $V_{CNTL}$ is set to 0.0 volts, transistors 38 and 40 are off and transistor 22 conducts with minimum drain-to-source impedance. Thus, attenuator circuit 16 provides minimum attenuation and minimum assertion loss, say 0.8 dB, for incoming signals from amplifier 14. Intermediate levels of attenuation are available by setting control voltage $V_{CNTL}$ at a value between 0.0 and 5.0 volts. Hence, attenuator 16 may operate either at minimum or maximum attenuation, or any attenuation level in-between.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. An attenuator circuit, comprising:
    a first transistor having a gate, a drain and a source, said drain receiving an input signal, said gate being coupled to a power supply conductor;
    a second transistor having a gate, a drain and a source, said gate receiving a control voltage, said drain receiving a reference voltage;
    first means coupled between said drain of said first transistor and said drain of said second transistor for providing DC isolation;
    second means coupled between said source of said second transistor and said power supply conductor for providing DC isolation;
    a third transistor having a gate, a drain and a source, said gate receiving said control voltage, said drain receiving said reference voltage;
    third means coupled between said source of said first transistor and said drain of said third transistor for providing DC isolation; and
    fourth means coupled between said source of said third transistor and said power supply conductor for providing DC isolation.

2. The attenuator circuit of claim 1 wherein said first means includes a first capacitor coupled between said drain of said first transistor and said drain of said second transistor.

3. The attenuator circuit of claim 2 wherein said second means includes a second capacitor coupled between said source of said second transistor and said power supply conductor.

4. The attenuator circuit of claim 3 wherein said third means includes a third capacitor coupled between said source of said first transistor and said drain of said third transistor.

5. The attenuator circuit of claim 4 wherein said fourth means includes a fourth capacitor coupled between said source of said third transistor and said power supply conductor.

6. The attenuator circuit of claim 5 further including:
    a first resistor coupled between said drain of said first transistor and said first capacitor; and
    a fifth capacitor coupled between said drain of said first transistor and said first capacitor.

7. The attenuator circuit of claim 6 further including a first inductor serially coupled with said second capacitor between said source of said second transistor and said power supply conductor.

8. The attenuator circuit of claim 7 further including a second inductor serially coupled with said fourth capacitor between said source of said third transistor and said power supply conductor.

9. The attenuator circuit of claim 8 further including:
    a second resistor having a first terminal receiving said control voltage and a second terminal coupled to said gate of said second transistor; and
    a third resistor having a first terminal receiving said control voltage and a second terminal coupled to said gate of said third transistor.

10. The attenuator circuit of claim 9 further including:
    a fourth resistor having a first terminal receiving said reference voltage and a second terminal;
    a fifth resistor coupled between said drain of said second transistor and said second terminal of said fourth resistor; and
    a sixth resistor coupled between said drain of said third transistor and said second terminal of said fourth resistor.

11. An attenuator circuit for setting attenuation between first and second nodes in response to a control signal, comprising:
    a first transistor having a gate, a drain and a source, said drain receiving an input signal from the first node, said gate being coupled to a power supply conductor, said source being coupled to the second node;
    a second transistor having a gate, a drain and a source, said gate receiving the control voltage, said drain receiving a reference voltage;
    a first capacitor coupled between the first node and said drain of said second transistor;
    a second capacitor coupled between said source of said second transistor and said power supply conductor;
    a third transistor having a gate, a drain and a source, said gate receiving the control voltage, said drain receiving said reference voltage;
    a third capacitor coupled between the second node and said drain of said third transistor; and
    a fourth capacitor coupled between said source of said third transistor and said power supply conductor.

12. The attenuator circuit of claim 11 further including:
    a first resistor coupled between the first node and said first capacitor; and
    a fifth capacitor coupled between the first node and said first capacitor.

13. The attenuator circuit of claim 12 further including a first inductor serially coupled with said second capacitor between said source of said second transistor and said power supply conductor.

14. The attenuator circuit of claim 13 further including a second inductor serially coupled with said fourth capacitor between said source of said third transistor and said power supply conductor.

15. The attenuator circuit of claim 14 further including:
- a second resistor having a first terminal receiving the control voltage and a second terminal coupled to said gate of said second transistor; and
- a third resistor having a first terminal receiving the control voltage and a second terminal coupled to said gate of said third transistor.

16. The attenuator circuit of claim 15 further including:
- a fourth resistor having a first terminal receiving said reference voltage and a second terminal;
- a fifth resistor coupled between said drain of said second transistor and said second terminal of said fourth resistor; and
- a sixth resistor coupled between said drain of said third transistor and said second terminal of said fourth resistor.

17. An integrated attenuator circuit for setting attenuation between first and second nodes in response to a control signal, comprising:
- a first FET having a gate, a drain and a source, said drain receiving an input signal from the first node, said gate being coupled to a power supply conductor, said source being coupled to the second node;
- a second FET having a gate, a drain and a source, said gate receiving the control voltage, said drain receiving a reference voltage;
- a first capacitor coupled between the first node and said drain of said second FET;
- a second capacitor coupled between said source of said second FET and said power supply conductor;
- a third FET having a gate, a drain and a source, said gate receiving the control voltage, said drain receiving said reference voltage;
- a third capacitor coupled between the second node and said drain of said third FET; and
- a fourth capacitor coupled between said source of said third FET and said power supply conductor.

18. The attenuator circuit of claim 17 further including:
- a first resistor coupled between the first node and said first capacitor; and
- a fifth capacitor coupled between the first node and said first capacitor.

19. The attenuator circuit of claim 18 further including a first inductor serially coupled with said second capacitor between said source of said second FET and said power supply conductor.

20. The attenuator circuit of claim 19 further including a second inductor serially coupled with said fourth capacitor between said source of said third FET and said power supply conductor.

* * * * *